United States Patent
Ahn et al.

(10) Patent No.: US 8,531,253 B2
(45) Date of Patent: Sep. 10, 2013

(54) SERIAL L-C RESONATOR WITH THREE-DIMENSIONAL STRUCTURE AND ULTRA-WIDE BANDPASS FILTER USING THE SAME

(75) Inventors: Dal Ahn, Cheonan-si (KR); Jong Im Park, Asan-si (KR)

(73) Assignee: Soonchunhyang University Industry Academy Cooperation Foundation, Asan-Si (KR)

( * ) Notice: Subject to any disclaimer, the term of this patent is extended or adjusted under 35 U.S.C. 154(b) by 560 days.

(21) Appl. No.: 12/810,290

(22) PCT Filed: Dec. 16, 2008

(86) PCT No.: PCT/KR2008/007446
§ 371 (c)(1),
(2), (4) Date: Jul. 22, 2010

(87) PCT Pub. No.: WO2009/082117
PCT Pub. Date: Jul. 2, 2009

(65) Prior Publication Data
US 2010/0277259 A1   Nov. 4, 2010

(30) Foreign Application Priority Data
Dec. 24, 2007  (KR) .................. 10-2007-0136164

(51) Int. Cl.
*H03H 7/01* (2006.01)
*H01P 1/203* (2006.01)
*H01P 7/08* (2006.01)

(52) U.S. Cl.
USPC ........... 333/185; 333/168; 333/219; 333/175; 333/204

(58) Field of Classification Search
USPC ................. 333/185, 204, 219, 205, 235, 168, 333/175
See application file for complete search history.

(56) References Cited

U.S. PATENT DOCUMENTS
2006/0255886 A1   11/2006   Ninomiya et al.

FOREIGN PATENT DOCUMENTS
| JP | 7-283679 A | 10/1995 |
| JP | 2002-26603 A | 1/2002 |
| JP | 2006-311306 A | 11/2006 |
| JP | 2007-243462 A | 9/2007 |
| KR | 10-2002-0085976 A | 11/2002 |
| KR | 10-2006-0075648 A | 7/2006 |
| KR | 10-2007-0034316 A | 3/2007 |

OTHER PUBLICATIONS

Park et al, "New Design Technique for Wide Band Pass Filters using Direct Frequency Conversion Design Method", Aug. 2007, ISSSE, 447-450.*
PCT International Search Report and Written Opinion, PCT/KR2008/007446, May 27, 2009, 6 Pages.

* cited by examiner

*Primary Examiner* — Benny Lee
*Assistant Examiner* — Gerald Stevens
(74) *Attorney, Agent, or Firm* — Fenwick & West LLP

(57) ABSTRACT

In an ultra-wideband (UWB) band-pass filter, an equivalent circuit of a band-pass filter for direct frequency conversion is configured to have a series LC resonator and a parallel LC resonator, the parallel LC resonator is implemented as a short stub and an open stub, and the series LC resonator is implemented by modeling an inductor and a capacitor as a distributed constant circuit. The series LC resonator is implemented to have a 3D structure for effective designing of the band-pass filter by a new method of implementing a series resonator circuit. In the UWB band-pass filter, a low-pass filter for improving band-stop characteristics is additionally connected.

7 Claims, 9 Drawing Sheets

| PARALLEL LC RESONATOR | L1=L9 | C1=C9 | L3=L7 | C3=C7 | L5 | C5 |
|---|---|---|---|---|---|---|
| ELEMENT VALUE | 3.257 nH | 0.648 pF | 1.47 nH | 1.436 pF | 1.392 nF | 1.517 pF |
| SERIES LC RESONATOR | L2=L8 | C2=C8 | L4=L6 | C4=C6 | | |
| ELEMENT VALUE | 2.839 nH | 0.7435 pF | 3.407 nH | 0.6196 pF | | |

[Figure 3

| | SHORT STUB | | | OPEN STUB | | |
|---|---|---|---|---|---|---|
| | $Z_{L1}=Z_{L9}$ | $Z_{L3}=Z_{L7}$ | $Z_{L5}$ | $Z_{L1}=Z_{L9}$ | $Z_{L3}=Z_{L7}$ | $Z_{L5}$ |
| SERIES LC RESONATOR | 132.2 Ω | 46.81 Ω | 51.02 Ω | 132.6 Ω | 20.57 Ω | 51.02 Ω |
| ELEMENT VALUE | 38.35° | 56.2° | 55.5° | 58° | 90° | 50° | ns
SERIAL L-C RESONATOR WITH THREE-DIMENSIONAL STRUCTURE AND ULTRA-WIDE BANDPASS FILTER USING THE SAME

TECHNICAL FIELD

This disclosure relates to an ultra-wideband (UWB) band-pass filter, and more particularly, to a series LC resonator with a 3D structure having good attenuation characteristics and band-stop characteristics in addition to insertion loss, and a UWB band-pass filter using the series LC resonator.

BACKGROUND ART

Recently, a communications system using ultra-wideband (UWB) characteristics is spotlighted. This is because high-speed wireless communications can be implemented through the utilization of UWB. Accordingly, a UWB system is spotlighted as the next-generation wireless technology based on a commercialized mobile communication network. The UWB system is a high-speed wireless communication technology utilizing a very wide bandwidth, and has been actively studied with much interest together with a wireless personal area network (WPAN) for ultra high-speed data transmission in an indoor wireless environment as a core technology for implementing a sensor network requiring ultra-high-precision resolution and a low-power ubiquitous network.

Until now UWB band-pass filters implemented by using various types of structure have been reported. However, there are problems in that the UWB band-pass filters have very narrow stop-bands and that undesirable pass-bands periodically occur.

DISCLOSURE

Technical Problem

There are provided a series LC resonator with a 3D structure to be applied to ultra-wideband (UWB) mobile telecommunications, and a UWB band-pass filter using the series LC resonator.

There are also provided a series LC resonator with a 3D structure having good attenuation characteristics and band-stop characteristics in addition to insertion loss, and a UWB band-pass filter using the series LC resonator.

Technical Solution

In one aspect, there is provided a series LC resonator with a 3D structure including: a dielectric substrate having a predetermined permittivity; pattern portions of a first conductive layer for the series LC resonator, which are formed in a predetermined pattern on portions of a surface of the substrate; and a pattern portion of a second conductive layer of a lower electrode part of a capacitor for the series LC resonator, which is formed on a portion of the other surface of the substrate, wherein the pattern portions of the first conductive layer have pattern portions of the first conductive layer representing an inductor for the series LC resonator and a pattern portion of the first conductive layer representing an upper electrode part of the capacitor for the series LC resonator, respectively, wherein the pattern portion of the first conductive layer representing the upper electrode part of the capacitor includes a first rectangular pattern portion of which one of first sides facing each other has a rectangular notch formed by removing a rectangular portion from the one of the first sides, wherein the pattern portions of the first conductive layer representing the inductor include: a second rectangular pattern portion disposed inside the notch to allow three sides to be disposed at the same interval from corresponding three sides of the notch; a third pattern portion which is formed integrally with the first pattern portion and extends from a portion of the other one of the first sides of the first pattern portion in a shape of a straight line having predetermined width and length; and a fourth pattern portion which is formed integrally with the second pattern portion and extends from a portion of the remaining side of the second pattern portion in a shape of a straight line having predetermined width and length, and wherein the second pattern portion is electrically connected to the pattern portion of the second conductive layer via a conductive layer inside a through-hole of the substrate.

In another aspect, there is provided an ultra-wideband (UWB) band-pass filter using a series LC resonator with a 3D structure, wherein the series LC resonator includes: a dielectric substrate having a predetermined permittivity; pattern portions of a first conductive layer of inductors and upper electrode parts of capacitors for the plurality of series LC resonators connected in series, which are formed on portions of an upper surface of the substrate; pattern portions of a first conductive layer for a plurality of parallel LC resonators each of which has a short stub and an open stub representing an inductor and a capacitor, respectively, the pattern portions being formed on portions of the upper surface of the substrate and electrically connected to the plurality of series LC resonators; and pattern portions of a second conductive layer of lower electrode parts of the capacitors for the series LC resonators, which are formed on portions of the other surface of the substrate.

In another aspect, there is provided an ultra-wideband (UWB) band-pass filter using a series LC resonator with a 3D structure, wherein the series LC resonator includes: a dielectric substrate having a predetermined permittivity; pattern portions for a band-pass filter including pattern portions of a first conductive layer of inductors and upper electrode parts of capacitors for the plurality of series LC resonator connected in series, which are formed on portions of an upper surface of the substrate, pattern portions of a second conductive layer of lower electrode parts of the capacitors for the series LC resonators, which are formed on portions of the other surface of the substrate, and pattern portions of the first conductive layer for a plurality of parallel LC resonators, which are formed on portions of the upper surface of the substrate, electrically connected to each of the plurality of series LC resonators, and each has a short stub and an open stub representing an inductor and a capacitor, respectively; pattern portions of the first conductive layer for a low-pass filter, which are formed on portions of the upper surface of the substrate so as to be electrically connected to rear ends of the pattern portions of the first conductive layer for the band-pass filter, in order to enhance band-stop characteristics of the band-pass filter, and each has a transmission line and an open stub representing an inductor and a capacitor, respectively; and pattern portions of a second conductive layer for grounding, which are formed on portions of the other surface of the substrate.

The short stub and the open stub of a portion of the parallel LC resonator may have a microstrip structure so as to be aligned with the corresponding pattern portion of the second conductive layer for grounding, and the short stub and the open stub of the other portion of the parallel LC resonator may have a suspended strip structure so as not to be aligned with the corresponding pattern portion of the second conductive layer for grounding.

The transmission line of the pattern portion of the first conductive layer for the low-pass filter may have a suspended strip structure so as not to be aligned with the corresponding pattern of the second conductive layer for grounding, and the open stub of the pattern portion of the first conductive layer for the low-pass filter may have a microstrip structure so as to be aligned with the corresponding pattern portion of the second conductive layer for grounding.

The pattern portion of the first conductive layer for grounding of the band-pass filter may be disposed on the upper surface of the substrate between the corresponding stubs of the band-pass filter in order to minimize coupling generated between the transmission lines.

The pattern portion of the first conductive layer for grounding of the low-pass filter may be disposed on the upper surface of the substrate between the corresponding stubs of the low-pass filter in order to minimize coupling generated between the transmission lines.

Advantageous Effects

By using an equivalent circuit of the band-pass filter for direct frequency conversion, a UWB band-pass filter improved to have the passband of 2 to 6 GHz, the insertion loss of 1.5 dB, the attenuation characteristic of equal to or less than 30 dB in the ranges of DC up to 1.4 GHz and 6.6 to 20 GHz, and the band-stop characteristic of equal to or less than 60 dB in the frequency band of 7.2 to 20 GHz may be implemented.

DESCRIPTION OF DRAWINGS

The above and other aspects, features and advantages of the disclosed exemplary embodiments will be more apparent from the following detailed description taken in conjunction with the accompanying drawings in which:

FIG. 3 is a 3D structural diagram illustrating a parallel LC resonator represented as a transmission line having an electrical length;

BEST MODE

Figure 1:
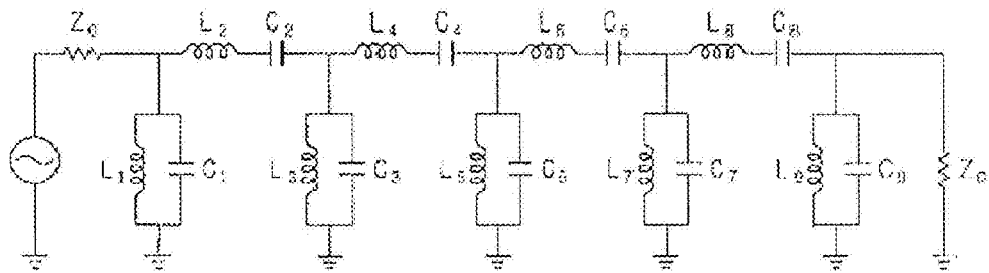
FIG. 1 is an equivalent circuit diagram of a band-pass filter for direct frequency conversion.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Hereinafter, a series LC resonator with a 3D structure and an ultra-wideband (UWB) band-pass filter using the series LC resonator according to exemplary embodiments will be described in detail with reference to the accompanying drawings.

In designing a general band-pass filter, a design method in which, after selecting a low-pass filter network of a prototype, an equivalent circuit is derived from this by frequency conversion and impedance matching, and modeling of passive elements using the derived equivalent circuit is conducted for optimization, is used. According to the embodiment disclosed herein, a new structure of a UWB band-pass filter of 2 to 6 GHz is designed from an equivalent circuit of a band-pass filter having an LC resonator for direct frequency conversion by setting each value of the LC resonator.

Figure 2:
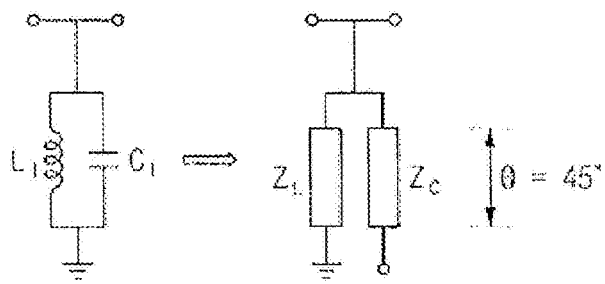
FIG. 2 is a table showing element values of the band-pass filter designed by using the equivalent circuit diagram of the band-pass filter illustrated in FIG. 1.

FIG. 1 is an equivalent circuit diagram of a band-pass filter for direct frequency conversion. FIG. 2 is a table showing element values of the band-pass filter designed by using the equivalent circuit diagram of the band-pass filter illustrated in FIG. 1.

Referring to FIG. 1, the equivalent circuit of the band-pass filter includes a plurality of, for example, four series LC resonators connected in series and a plurality of, for example, five parallel LC resonators connected in parallel. The four series LC resonators are constituted by first, second, third, and fourth series LC resonators, and the five parallel LC resonators are constituted by first, second, third, fourth, and fifth parallel LC resonators.

The first series LC resonator includes an inductor $L_2$ and a capacitor $C_2$ connected in series, the second series LC resonator includes an inductor $L_4$ and a capacitor $C_4$ connected in series, the third series LC resonator includes an inductor $L_6$ and a capacitor $C_6$ connected in series, and the fourth series LC resonator includes an inductor $L_8$ and a capacitor $C_8$ connected in series. Likewise, the first parallel LC resonator includes an inductor $L_1$ and a capacitor $C_1$ connected in parallel, the second parallel LC resonator includes an inductor $L_3$ and a capacitor $C_3$ connected in parallel, the third parallel LC resonator includes an inductor $L_5$ and a capacitor $C_5$ connected in parallel, the fourth parallel LC resonator includes an inductor $L_7$ and a capacitor $C_7$ connected in parallel, and the fifth parallel LC resonator includes an inductor $L_9$ and a capacitor $C_9$ connected in parallel.

When each element is designed from the equivalent circuit of the band-pass filter of FIG. 1 so that a passband is the range of 2 to 6 GHz, a center frequency is 4 GHz, a passband ripple is 0.01 dB, and a ninth order is implemented, values of the elements of the band-pass filter are as shown in FIG. 2.

Referring to FIG. 2, in the parallel LC resonator, the inductance of both of the inductors $L_1$ and $L_9$ is 3.25 nH, the capacitance of both of the capacitors $C_1$ and $C_9$ is 0.648 pF, the inductance of both of the inductors $L_3$ and $L_7$ is 1.47 nH, the capacitance of both of the capacitors $C_3$ and $C_7$ is 1.436 pF, the inductance of the inductor $L_5$ is 1.392 nH, and the capacitance of the capacitor $C_5$ is 1.517 pF.

In addition, in the series LC resonator, the inductance of both of the inductors $L_2$ and $L_8$ is 2.839 nH, the capacitance of both of the capacitors $C_2$ and $C_8$ is 0.7435 pF, the inductance of both of the inductors $L_4$ and $L_6$ is 3.407 nH, and the capacitance of both of the capacitors $C_4$ and $C_6$ is 0.6196 pF.

In the band-pass filter having the element values described above, the parallel LC resonator and the series LC resonator may be modeled as distributed constant circuits. Specifically, the parallel LC resonator may be modeled as the distributed constant circuit illustrated in FIG. 3, and the series LC resonator may be modeled as the distributed constant circuit illustrated in FIG. 5.

FIG. 3 is a 3D structural diagram illustrating the parallel LC resonator represented as a transmission line having an electrical length.

Referring to FIG. 3, the first parallel LC resonator illustrated in FIG. 1 may be implemented to have a short stub L and an open stub C each of which has an electrical length of 45° Impedances $Z_L$ and $Z_C$ of the lines may be represented as Equation 1.

$$X_L = \omega L_1 \quad \text{[Equation 1]}$$
$$X_C = -\frac{1}{\omega C_1}$$

Figure 4:
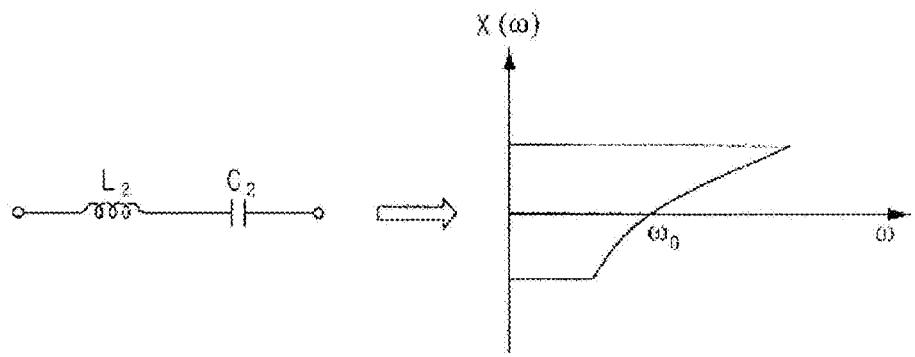
FIG. 4 is a graph showing a reactance of a series LC resonator.

FIG. 4 is a graph showing a reactance X of the series LC resonator.

Referring to FIG. 4, for modeling the first series LC resonator of FIG. 1 as the distributed constant circuit, Equation 2 which defines the reactance X of the first series LC resonator and Equation 3 which defines a slop parameter thereof may be used to obtain the distributed constant circuit.

$$X = \omega L_2 - \frac{1}{\omega C_2} \quad \text{[Equation 2]}$$

$$x = \frac{\omega_0}{2} \frac{dX}{d\omega}\bigg|_{\omega=\omega_0} \quad \text{[Equation 3]}$$

Figure 5:
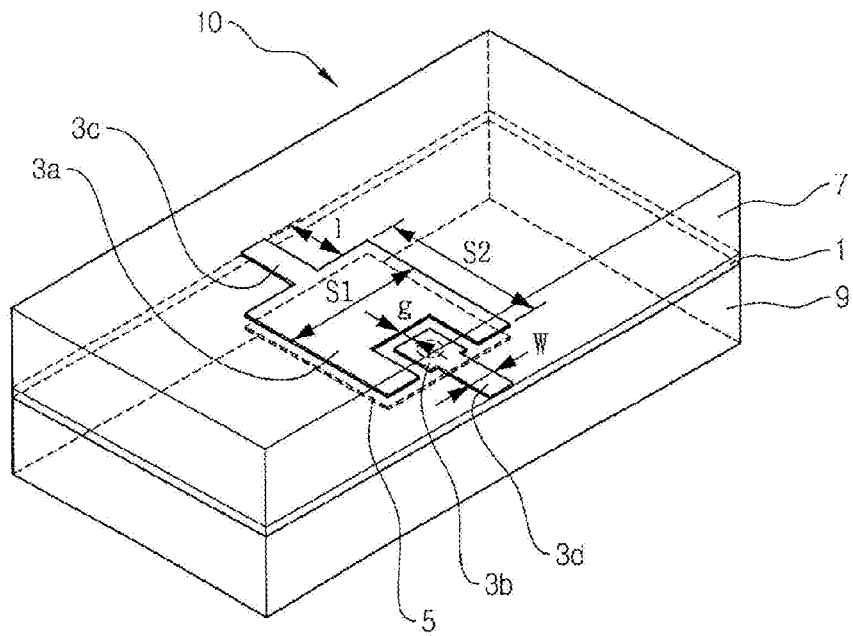
FIG. 5 is a 3D structural diagram illustrating a series LC resonator with a 3D structure implemented as a distributed constant circuit according to an embodiment.

FIG. 5 is a 3D structural diagram illustrating the series LC resonator with a 3D structure implemented as the distributed constant circuit according to the embodiment.

In order to obtain a suitable distributed constant circuit for the reactance X of the series LC resonator in Equation 3, as illustrated in FIG. 5, an electromagnetic field simulation (EM simulation) of the series LC resonator 10 with a 3D structure having an electrical length representing the inductor and a pattern representing the capacitor is conducted. The EM simulation is a simulation for analyzing characteristics of distributed constant circuits by using a high frequency structure simulator (HFSS) tool which is a 3D EM simulator.

In the series LC resonator 10 with a 3D structure, on a surface, for example, on an upper surface of a dielectric substrate 1 having a predetermined permittivity, first pattern portion 3a of a first conductive layer of upper electrode part for capacitor of the series LC resonator, and second, third, and fourth pattern portions 3b, 3c, and 3d of a first conductive layer for inductor of the series LC resonator may be formed, and on a portion of the other surface, for example, on a lower surface of the substrate 1, a corresponding pattern portion 5 of a second conductive layer of lower electrode part for capacitor of the series LC resonator may be formed. In addition, on the upper surface of the substrate 1 having the first, second, third, and fourth pattern portions 3a, 3b, 3c, and 3d, an air layer 7 may be disposed, and under the lower surface of the substrate 1 having the pattern portion 5 of the second conductive layer, an air layer 9 may be disposed.

The first pattern portion 3a is a rectangular pattern portion having first sides with a length of S1 and second sides having a length of S2 and is provided with a rectangular notch by removing a rectangular portion from one of the first sides. The second pattern portion 3b is a rectangular pattern portion disposed on the substrate 1 inside the rectangular notch of the first pattern portion 3a, and each of three sides of the second pattern portion 3b is disposed at an interval g from the corresponding sides of the notch of the first pattern potion 3a. The third pattern portion 3c is formed integrally with the first pattern portion 3a and extends from a portion of the other one of the first sides of the first pattern portion 3a toward an adjacent side of the substrate 1 in a shape of, for example, a straight line having a width of W and a length of l. The fourth pattern portion 3d is formed integrally with the second pattern portion 3a and extends from a portion of the remaining side of the second pattern portion 3b toward an adjacent side of the substrate 1 in a shape of a straight line having a width of W and a length of l.

The pattern portion 5 of the second conductive layer is formed under the lower surface of the substrate 1 to be disposed below the first and second pattern portions 3a and 3b as a single rectangular pattern portion.

In addition, the second pattern portion 3b is electrically connected to the pattern portion 5 of the second conductive layer via a conductive layer (not shown) inside a through-hole passing through the substrate 1 under a portion of the second pattern portion 3b.

The permittivity of the substrate 1 may be an arbitrary value. According to the embodiment, the permittivity of the substrate is 2.2. The thickness of the substrate 1 may be an arbitrary value. According to the embodiment, the thickness is 5 mils.

Figure 6:
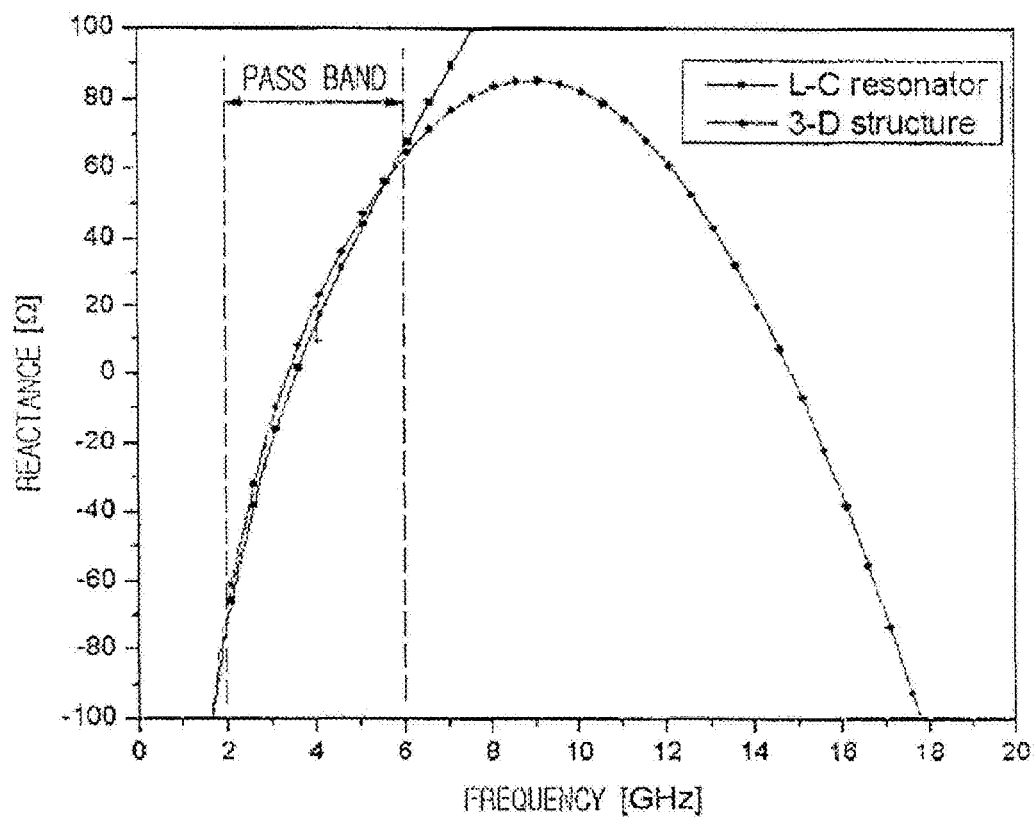
FIG. 6 is a graph showing the reactances of the series LC resonator with a 3D structure illustrated in FIG. 5 and a general series LC resonator.

FIG. 6 is a graph showing the reactances of the series LC resonator with a 3D structure illustrated in FIG. 5 and a general series LC resonator.

Referring to FIG. 6, by comparing the reactance obtained by conducting the EM simulation of the series LC resonator 10 with a 3D structure illustrated in FIG. 5, with the reactance for the element values (inductance L of 2.839 nH and capacitance C of 0.7435 pF) of the series LC resonator, it is checked whether the reactances are equal to each other in the passband of 2 to 6 GHz. As illustrated in FIG. 6, it can be seen that the reactances are substantially equal to each other in the passband of 2 to 6 GHz.

Figure 7:
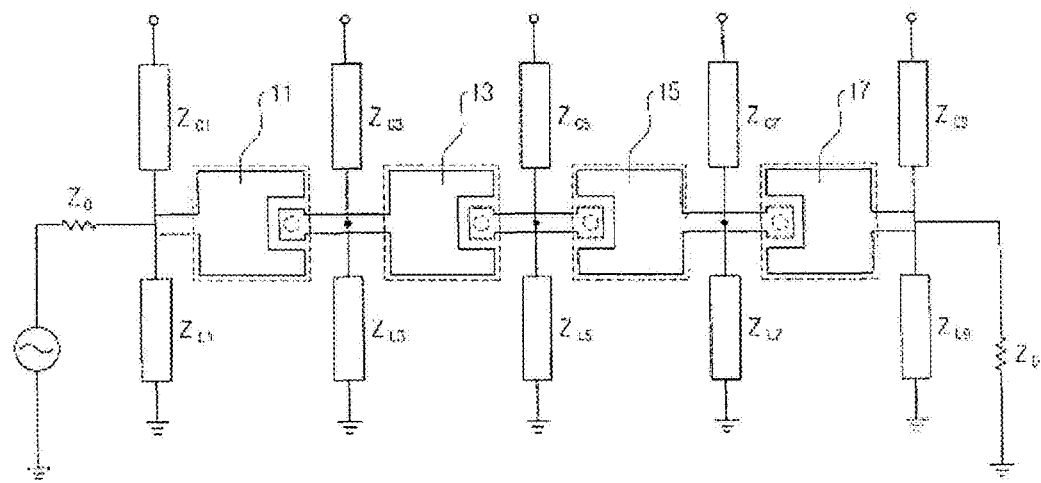
FIG. 7 is an equivalent circuit diagram of a ultra-wideband (UWB) band-pass filter according to another embodiment using parallel LC resonators and series LC resonators with a 3D structure.

FIG. 7 is an equivalent circuit diagram of a UWB band-pass filter using a series LC resonator with a 3D structure according to another embodiment, and more specifically is an equivalent circuit diagram of a parallel LC resonator and a series LC resonator implemented as distributed constant circuits.

Referring to FIG. 7, the UWB band-pass filter according to the embodiment includes series LC resonators implemented in a 3D structure as the series LC resonator 10 illustrated in FIG. 5, for example, four, that is, first, second, third, and fourth series LC resonators 11, 13, 15, and 17 connected in series, and parallel LC resonators illustrated in FIG. 3, for example, 5, that is, first, second, third, fourth, and fifth parallel LC resonators connected in parallel.

The first parallel LC resonator includes a short stub $Z_{L1}$ and an open stub $Z_{C1}$ connected in parallel, the second parallel LC resonator includes a short stub $Z_{L3}$ and an open stub $Z_{C3}$ connected in parallel, the third parallel LC resonator includes a short stub $Z_{L5}$ and an open stub $Z_{C5}$ connected in parallel, the fourth parallel LC resonator includes a short stub $Z_{L7}$ and an open stub $Z_{C7}$ connected in parallel, and the fifth parallel LC resonator includes a short stub $Z_{L9}$ and an open stub $Z_{C9}$ connected in parallel.

Here, S-parameter values obtained by conducting the EM simulation of the first, second, third, and fourth series LC resonators 11, 13, 15, and 17 implemented in the 3D structure are applied to the equivalent circuit. The impedances and the electrical lengths of the short stub L and the open stub C obtained from Equation 1 by using the S-parameter values are slightly changed. In consideration of the changed values, the characteristics of the band-pass filter are allowed to be properly exhibited.

Figures 8, 9:
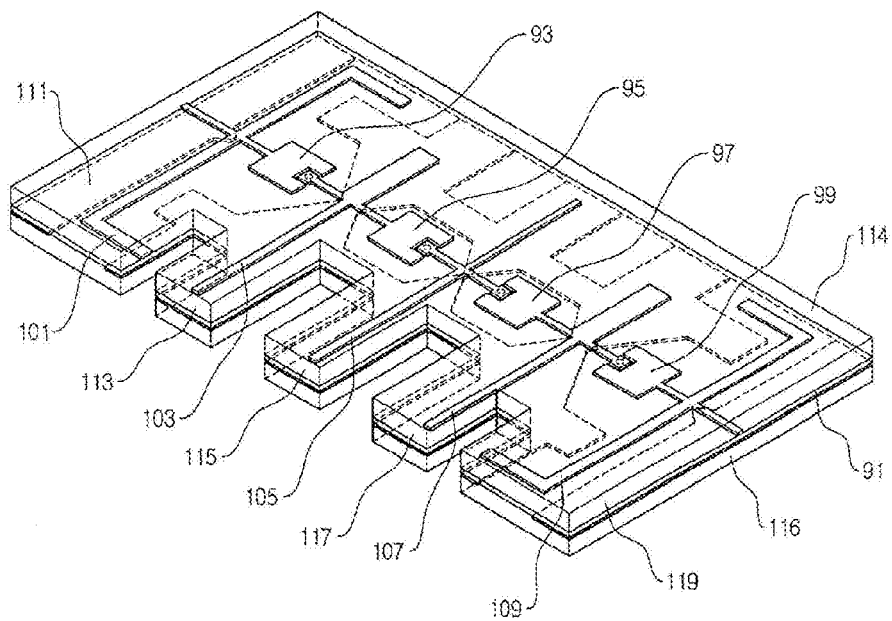
FIG. 8 is a table showing changed impedances Z and electrical lengths of a short stub L and an open stub C in the parallel LC resonator of FIG. 7.
FIG. 9 is a structural diagram used for a 3D simulation of the UWB band-pass filter according to another embodiment that is optimally designed by implementing the value of each resonator of the equivalent circuit diagram of FIG. 7.

FIG. 8 is a table showing the changed impedances Z and electrical lengths of the short stub L and the open stub C in the parallel LC resonator of FIG. 7.

Referring to FIG. 8, in the case of the short stubs, the impedance Z of both of the $Z_{L1}$ and the $Z_{L9}$ is 132.2Ω, the impedance Z of both of the $Z_{L3}$ and the $Z_{L7}$ is 46.81Ω, and the impedance Z of the $Z_{L5}$ is 51.02Ω. In addition, the electrical length θ of both of the $Z_{L1}$ and the $Z_{L9}$ is 39.35°, the electrical length θ of both of the $Z_{L3}$ and the $Z_{L7}$ is 58.2°, and the electrical length θ of the $Z_{L5}$ is 55.5°.

In the case of the open stubs, the impedance Z of both of the $Z_{C1}$ and the $Z_{C9}$ is 132.6Ω, the impedance Z of both of the $Z_{C3}$ and the $Z_{C7}$ is 20.57Ω, and the impedance Z of the $Z_{C5}$ is 51.02Ω. In addition, the electrical length θ of both of the $Z_{C1}$ and the $Z_{C9}$ is 58°, the electrical length θ of both of the $Z_{C3}$ and the $Z_{C7}$ is 90°, and the electrical length θ of the $Z_{C5}$ is 50°.

FIG. 9 is a structural diagram used for a 3D simulation of the UWB band-pass filter using the series LC resonators with a 3D structure according to the another embodiment, and more specifically, a structural diagram for a 3D simulation of the UWB band-pass filter optimally designed by implementing the value of each resonator of the equivalent circuit diagram illustrated in FIG. 7.

Referring to FIG. 9, in the UWB band-pass filter according to the embodiment, on portions of a surface, for example, on an upper surface of a dielectric substrate 91, a pattern portion for a transmission line is formed, and on portions of the other surface, for example, on a lower surface of the substrate 91, a pattern portion for a ground layer is formed. A structure in which a pattern portion of a ground layer is formed directly under a corresponding pattern portion of a transmission line is referred to as a microstrip structure, and a structure in which a pattern portion of a ground layer is not formed directly under a corresponding pattern portion of a transmission line is referred to as a suspended strip structure.

In the case where the series LC resonator is implemented as the distributed constant circuit, on portions of a surface, for example, on the upper surface of the dielectric substrate 91, for a plurality of, for example, four serial LC resonators, pattern portions 93, 95, 97, and 99 of a first conductive layer are formed as electrical lengths representing inductors and patterns representing capacitors in the suspended stripline structure. The pattern portions 93, 95, 97, and 99 of the first conductive layer are formed as the same pattern as illustrated in FIG. 5 to be connected in series. For example, they are arranged in a row.

In the case of the parallel LC resonators, on corresponding portions of the upper surface of the substrate 91, pattern portions 101, 103, 105, 107, and 109 of the first conductive layer for short stubs and open stubs implemented as a plurality of, for example, five parallel LC resonators are formed. The pattern portions 101, 103, 105, 107, and 109 of the first conductive layer are electrically connected to the corresponding pattern portions 93, 95, 97, and 99, and extend in both directions perpendicular to an arrangement direction of the pattern portions 93, 95, 97, and 99. When arbitrary portions, for example, the pattern portions 101 and 109 need to be extended over corresponding sides of the substrate 91, the pattern portions 101 and 109 may be bent at right angles at suitable positions to extend straight.

In addition, a plurality of, for example, five pattern portions 111, 113, 115, 117, and 119 of a second conductive layer for the ground layer are formed under corresponding portions of the other surface, for example, the lower surface of the substrate 91.

In the case of the short stubs and the open stubs implemented as the parallel LC resonators, a microstrip structure (not shown) or a suspended strip structure (not shown) is determined depending on the impedances of the short stub L representing the inductor and the open stub C representing the capacitor. When the impedances are high, it is difficult to implement the short stub L and the open stub C as the microstrip structure. Therefore, the suspended stripline structure is implemented Accordingly, the pattern portions 111 and 119 for grounding are not disposed directly under the pattern portions 101 and 109, respectively, whereas the ground pattern portions 113, 115, and 117 are disposed directly under the pattern portions 103, 105, and 107, respectively.

In addition, the pattern portions 111, 113, 115, 117, and 119 are disposed so as not to be aligned with the pattern portions 93, 95, 97, and 99 unlike in FIG. 5. Moreover, in order to minimize coupling generated between the transmission lines, the pattern portions 113, 115, and 117 for grounding may be disposed between the adjacent stubs.

The air layers 114 and 116 are formed on and under the substrate 91, respectively. The permittivity of the substrate 91 may have an arbitrary value. According to the embodiment, the permittivity of the substrate is 2.2. The thickness of the substrate may be an arbitrary value. According to the embodiment, the thickness is 5 mils. The distances between upper and lower surfaces of the substrate 91 and corresponding upper and lower ground surfaces inside a housing (not shown) for holding the substrate, respectively, may be in the range of 0.9 to 1.1 mm, and more specifically, 1 mm.

Figure 10:
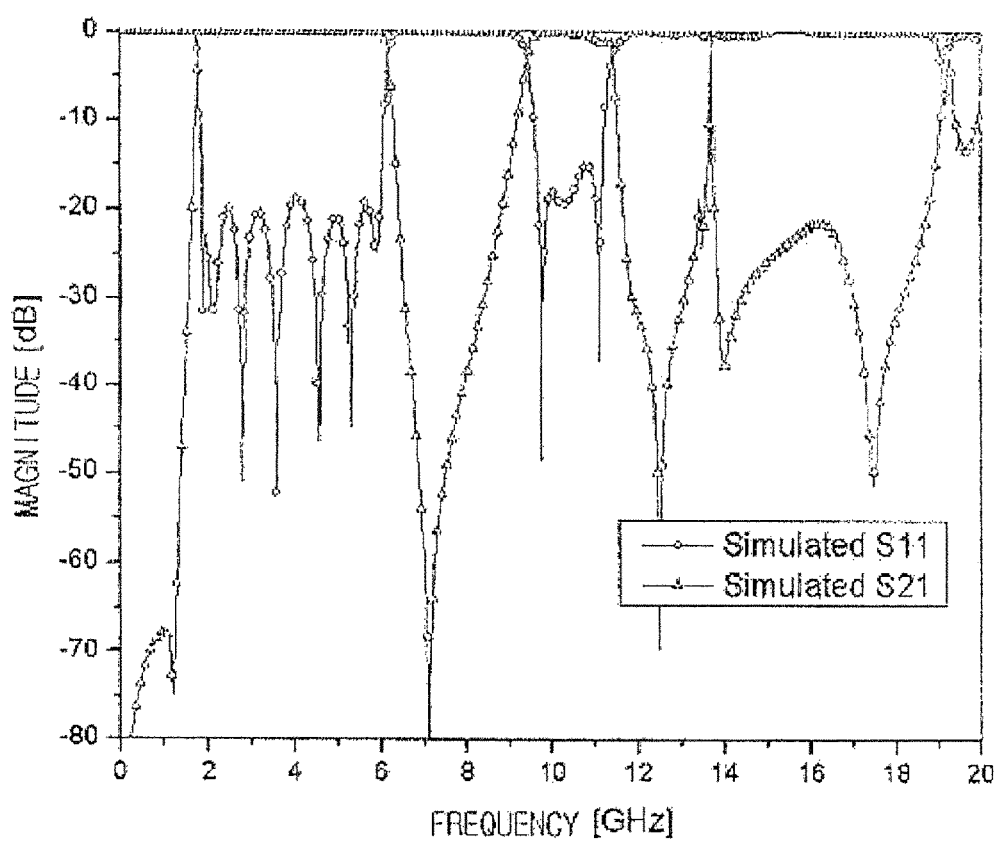
FIG. 10 is a graph showing S-parameters obtained by conducting the simulation of the optimized UWB band-pass filter of FIG. 9.

FIG. 10 is a graph showing S-parameters obtained by conducting the simulation of the optimized UWB band-pass filter of FIG. 9.

Referring to FIG. 10, when the simulation of the band-pass filter having the structure of FIG. 9 is conducted, from the characteristic of the S-parameters S11 and S21 corresponding to the return loss and the insertion loss, respectively, it can be seen that the passband is the range of 2 to 6 GHz and the return loss is equal to or less than 20 dB. In addition, undesirably, it can be seen that an unwanted passband periodically appears in the band of 7.2 to 20 GHz. Therefore, in order for the band-pass filter having the structure illustrated in FIG. 9 to have flat band-stop characteristics in the range of 7.2 to 20 GHz below 60 dB, a low-pass filter is additionally needed.

Figure 11:
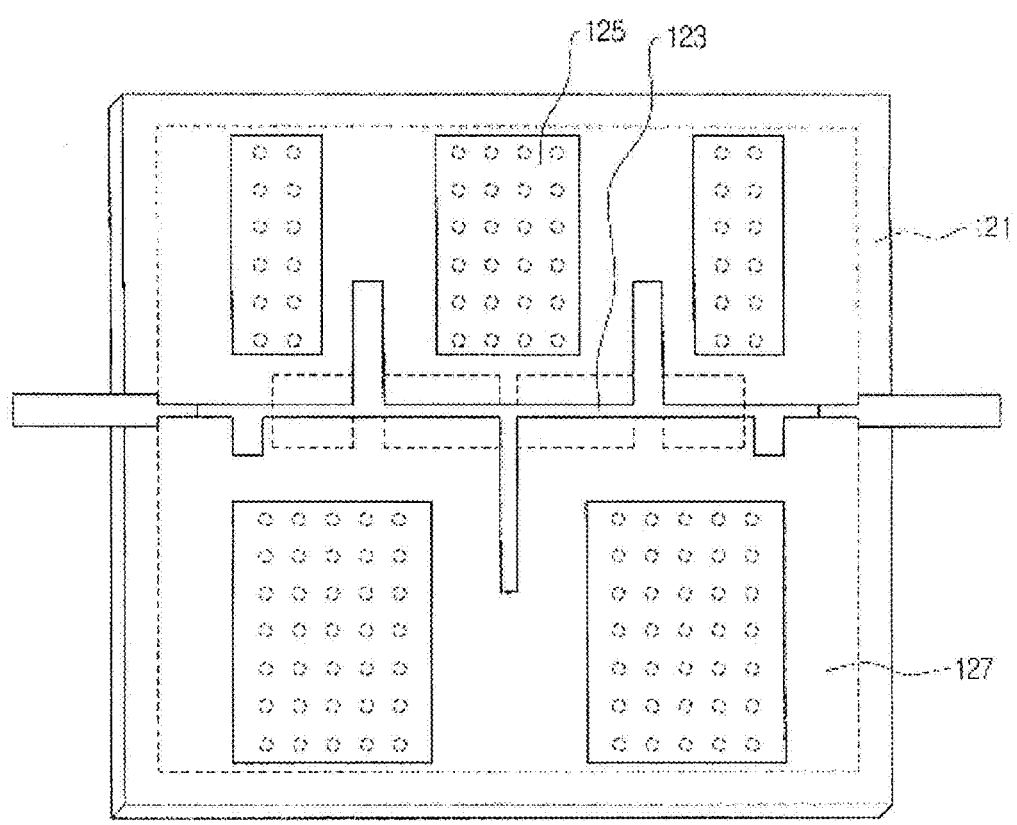
FIG. 11 is a 3D structural diagram for an electromagnetic field simulation (EM simulation) of a low-pass filter applied to the UWB band-pass filter of FIG. 7.

FIG. 11 is a 3D structural diagram for an EM simulation of the UWB band-pass filter using the series LC resonators with a 3D structure according to the another embodiment.

Referring to FIG. 11, after designing the LC circuit to allow the low-pass filter according to the another embodiment to have, for example, a cutoff frequency of 7 GHz, a passband ripple of 0.01 dB, and a ninth order, in order to implement the LC circuit as the distributed constant circuit, that is, the transmission line, the impedances of the transmission line for implementing the inductor and the capacitor are obtained by using the known equation, so that physical magnitudes can be changed from the obtained impedance by using the circuit design tool. Specifically, first, information on a substrate to be used is input. The permittivity of the substrate 121 may be an arbitrary value. According to the embodiment, the permittivity of the substrate is 2.2. The thickness of the substrate may be an arbitrary value. According to the embodiment, the thickness is 5 mils. Distances between upper and lower surfaces of the substrate 121 and corresponding upper and lower ground surfaces inside a housing (not shown) for holding the substrate, respectively, that is, the heights of the air layers, are input as values of 0.9 to 1.1 mm, and more specifically 1 mm. In the case of the capacitor, when an electrical length of 19.95° and the cutoff frequency of 7 GHz are input for the impedance 30Ω the corresponding magnitude of the transmission line can be obtained. In the case of the inductor, similarly, when an electrical length of 45.51° is input for the impedance 100Ω the corresponding magnitude of the transmission line can be obtained. When the magnitude of the transmission line is determined, the final structure of the low-pass filter is as illustrated in FIG. 11.

In the low-pass filter illustrated in FIG. 11, on portions of a surface, for example, on an upper surface of a dielectric substrate 121, a first pattern portion 123 of the first conductive layer for inductors and capacitors implemented as the transmission lines is formed, and on portions of the other surface, for example, on a lower surface of the substrate 121, a second pattern portion 127 for a ground layer is formed. A structure in which the second pattern portion 127 is not formed directly under the corresponding first pattern portion 123 is referred to as a suspended strip structure, and a structure in which the second pattern portion 127 is formed directly under the corresponding first pattern portion 123 is referred to as a microstrip structure.

In the low-pass filter, since the impedance of the transmission line representing the inductor is high, the transmission line is configured to have the suspended strip structure, and the open stub representing the capacitor is configured to have the microstrip structure.

In addition, similarly to band-pass filter of FIG. 9, in order to minimize coupling generated between the transmission lines, a third pattern portion 125 for a ground layer may be additionally formed on portions of the upper surface of the dielectric substrate 121 so as to be disposed between the stubs. The third pattern portion 125 is electrically connected to the second pattern portion 127 via the conductive layer inside a plurality of through-holes (displayed as dotted circles) passing through the substrate 121.

Figure 12:
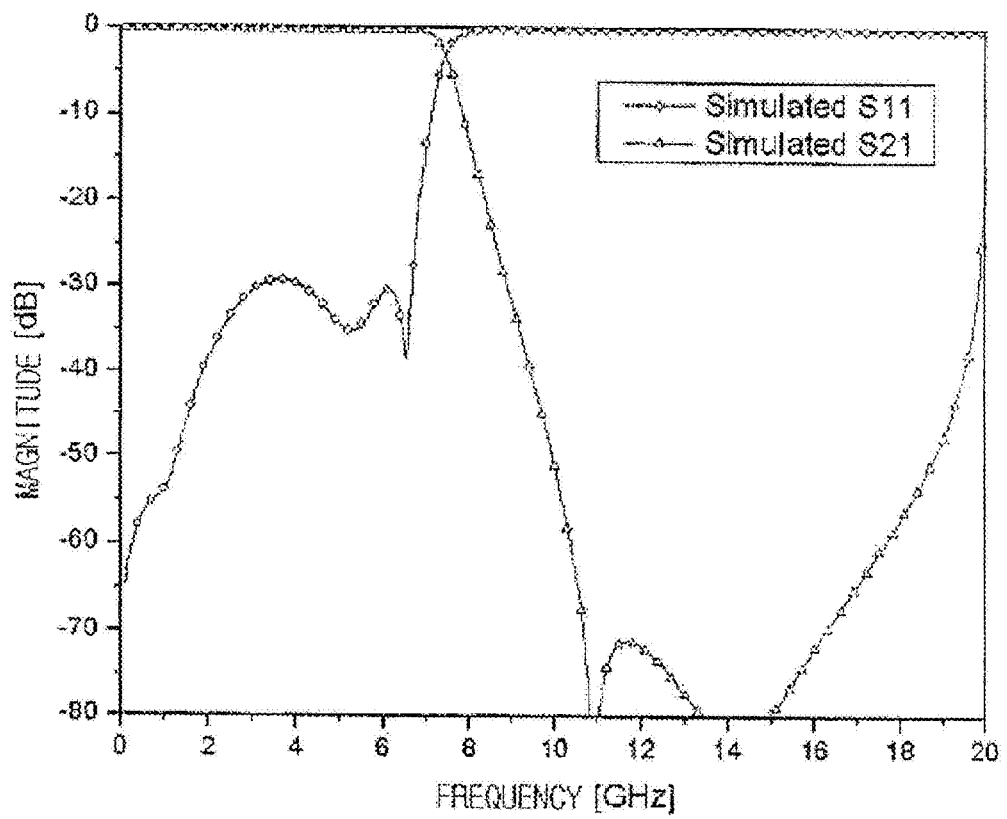
FIG. 12 is a graph showing S-parameters obtained by conducting the simulation of the low-pass filter of FIG. 11.

FIG. 12 is a graph showing S-parameters obtained by conducting the simulation of the low-pass filter of FIG. 11

Referring to FIG. 12, when the simulation of the low-pass filter according to the embodiment is conducted, from the characteristics of the S-parameters S11 and S21 corresponding to the return loss and the insertion loss, respectively, it can be seen that the cutoff frequency is 7 GHz, the return loss is equal to or less than 26 dB, and the insertion loss is in the range of 10 to 18 GHz in the band equal to or less than 60 dB.

Figure 13:
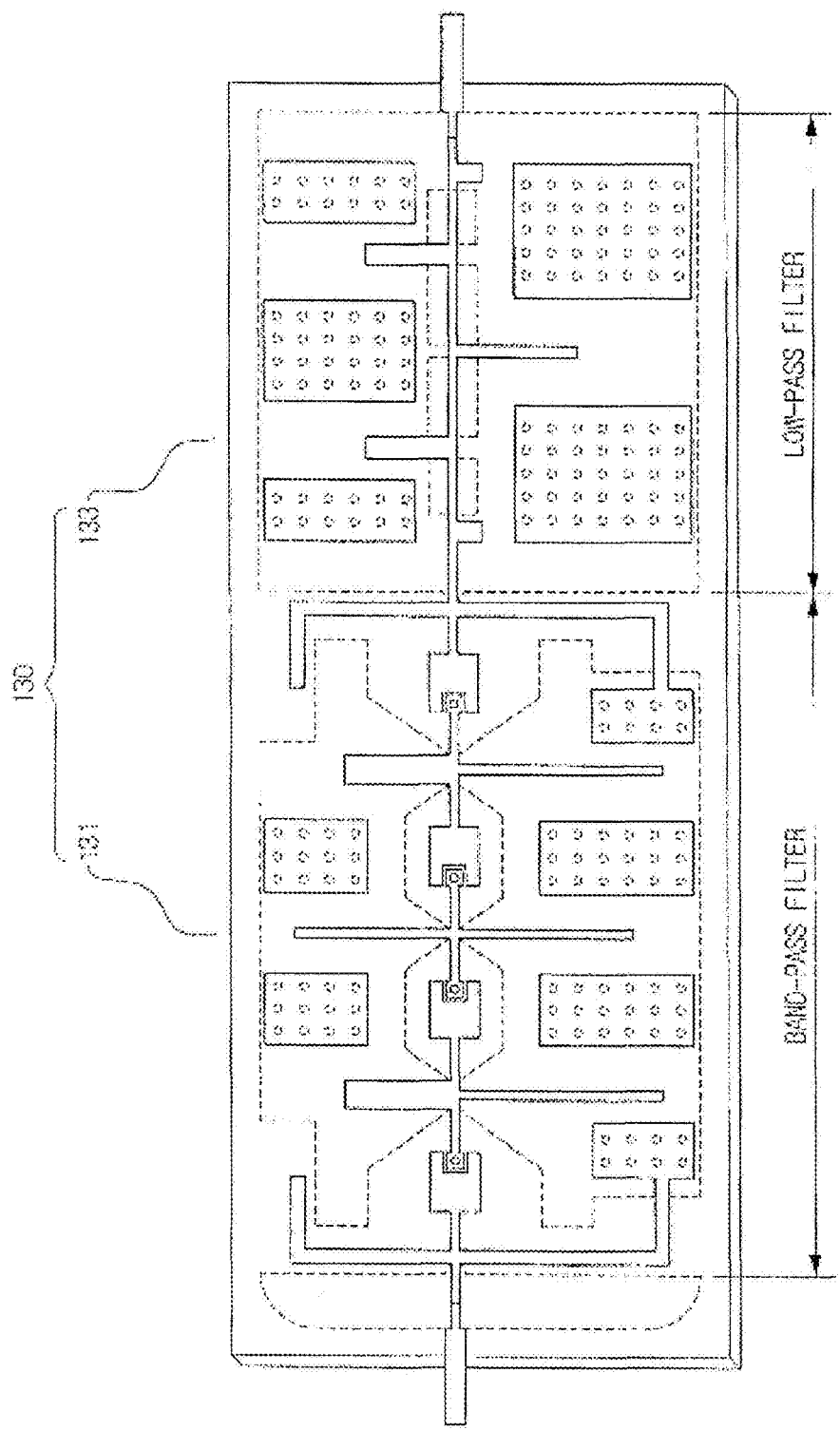
FIG. 13 a structural diagram of the band-pass filter of FIG. 9 and the low-pass filter of FIG. 11 which are combined with each other.

FIG. 13 is a structural diagram of the UWB band-pass filter using the series LC resonators with a 3D structure according to the another embodiment, and more specifically, a structural diagram of the band-pass filter illustrated in FIG. 9 and the low-pass filter illustrated in FIG. 11 which are combined with each other.

Referring to FIG. 13, the UWB band-pass filter 130 according to the embodiment has a structure in which the band-pass filter 131 illustrated in FIG. 9 and the low-pass filter 133 illustrated in FIG. 11 are formed on a single dielectric substrate and the low-pass filter 133 is electrically connected to the rear terminal of the band-pass filter 131.

Here, in the band-pass filter 131 and the low-pass filter 133, in order to minimize coupling generated between the transmission lines, a pattern portion for grounding is additionally formed on the upper surface of the substrate between the adjacent stubs, thereby improving the characteristic of the band-pass filter 130.

In addition, the pattern portion for grounding formed on the upper surface of the substrate is electrically connected to the pattern portion for grounding formed under the lower surface of the substrate via the conductive layer inside through-holes (shown as dotted circles) passing through the substrate (not shown).

For the convenience of description and in order to avoid redundancy, a description of the structures of the band-pass filter and the low-pass filter is omitted.

Figure 14:
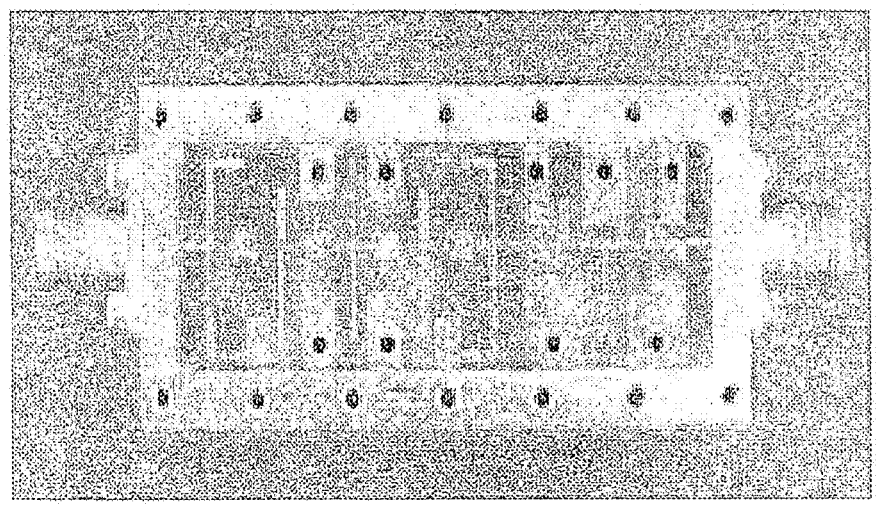
FIG. 14 is a photograph showing the UWB band-pass filter mounted in a housing, which is actually manufactured to have the 3D structure illustrated in FIG. 13.

FIG. 14 is a photograph showing the UWB band-pass filter mounted in a housing, which is actually manufactured to have the 3D structure illustrated in FIG. 13.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

The invention claimed is:

1. A series LC resonator with a 3D structure comprising:
a dielectric substrate having a predetermined permittivity;
pattern portions of a first conductive layer for the series LC resonator, which are formed in a predetermined pattern on portions of a surface of the substrate; and
a pattern portion of a second conductive layer of a lower electrode part of a capacitor for the series LC resonator, which is formed on a portion of the other surface of the substrate,
wherein the pattern portions of the first conductive layer have pattern portions of the first conductive layer representing an inductor for the series LC resonator and a pattern portion of the first conductive layer representing an upper electrode part of the capacitor for the series LC resonator, respectively,
wherein the pattern portion of the first conductive layer representing the upper electrode part of the capacitor includes a first rectangular pattern portion of which one of first sides facing each other has a rectangular notch formed by removing a rectangular portion from the one of the first sides,
wherein the pattern portions of the first conductive layer representing the inductor include:
a second rectangular pattern portion disposed inside the notch to allow three sides to be disposed at a same interval from corresponding ones of three sides of the notch;
a third pattern portion which is formed integrally with the first pattern portion and extends from a portion of the other one of the first sides of the first pattern portion in a shape of a straight line having a predetermined width and length; and
a fourth pattern portion which is formed integrally with the second rectangular pattern portion and extends from a portion of the remaining side of the second rectangular pattern portion in a shape of a straight line having a predetermined width and length, and
wherein the second rectangular pattern portion is electrically connected to the pattern portion of the second conductive layer via a conductive layer inside a throughhole of the substrate.

2. An ultra-wideband (UWB) band-pass filter using a plurality of series LC resonators, each comprising features of the series LC resonator with the 3D structure according to claim 1, wherein the plurality of the series LC resonators comprise:
a dielectric substrate having a predetermined permittivity;
pattern portions of a first conductive layer of inductors and upper electrode parts of capacitors for the plurality of the series LC resonators connected in series, which are formed on portions of an upper surface of the substrate;
pattern portions of a first conductive layer for a plurality of parallel LC resonators each of which has a short stub and an open stub representing an inductor and a capacitor, respectively, the pattern portions being formed on portions of the upper surface of the substrate and electrically connected to the plurality of the series LC resonators; and
pattern portions of a second conductive layer of lower electrode parts of the capacitors for the plurality of the series LC resonators, which are formed on portions of the other surface of the substrate.

3. An UWB band-pass filter using a plurality of series LC resonators, each comprising features of the series LC resonator with the 3D structure according to claim 1, wherein the plurality of the series LC resonators comprise:
a dielectric substrate having a predetermined permittivity;
pattern portions for band-pass filtering including pattern portions of a first conductive layer of inductors and upper electrode parts of capacitors for the plurality of the series LC resonators connected in series, which are formed on portions of an upper surface of the substrate,
pattern portions of a second conductive layer of lower electrode parts of the capacitors for the plurality of the series LC resonators, which are formed on portions of the other surface of the substrate, and pattern portions of the first conductive layer for a plurality of parallel LC resonators, which are formed on portions of the upper surface of the substrate, electrically connected to each of the plurality of the series LC resonators, and each has a short stub and an open stub representing an inductor and a capacitor, respectively;
pattern portions of the first conductive layer for low-pass filtering, which are formed on portions of the upper surface of the substrate so as to be electrically connected to rear ends of the pattern portions of the first conductive layer for the band-pass filter, in order to enhance band-stop characteristics of the band-pass filter, and each has a transmission line and an open stub representing an inductor and a capacitor, respectively; and
pattern portions of a second conductive layer for grounding, which are formed on portions of the other surface of the substrate.

4. The UWB band-pass filter according to claim 2 or 3,
wherein the short stub and the open stub of a portion of the plurality of the parallel LC resonators have a microstrip structure so as to be aligned with the corresponding pattern portion of the second conductive layer for grounding, and
wherein the short stub and the open stub of the other portion of the plurality of the parallel LC resonators have a suspended strip structure so as not to be aligned with the corresponding pattern portion of the second conductive layer for grounding.

5. The UWB band-pass filter according to claim 3,
wherein the transmission line of the pattern portions of the first conductive layer for the low-pass filter has a suspended strip structure so as not to be aligned with the corresponding one of the pattern portions of the second conductive layer for grounding, and
wherein the open stubs of the pattern portions of the first conductive layer for the low-pass filter has a microstrip structure so as to be aligned with the corresponding one of the pattern portions of the second conductive layer for grounding.

6. The UWB band-pass filter according to claim 3, wherein the pattern portions of the first conductive layer for grounding of the band-pass filter is disposed on the upper surface of the substrate between the corresponding open stubs or between the corresponding short stubs of the band-pass filter in order to minimize coupling generated between the transmission lines.

7. The UWB band-pass filter according to claim 3, wherein the pattern portions of the first conductive layer for grounding of the low-pass filter is disposed on the upper surface of the substrate between the corresponding open stubs or between the corresponding short stubs of the low-pass filter in order to minimize coupling generated between the transmission lines.

* * * * *